United States Patent [19]
Abe

[11] Patent Number: 5,126,695
[45] Date of Patent: Jun. 30, 1992

[54] SEMICONDUCTOR INTEGRATED CIRCUIT DEVICE OPERATED WITH AN APPLIED VOLTAGE LOWER THAN REQUIRED BY ITS CLOCK OSCILLATOR

[75] Inventor: Sachiyuki Abe, Suwa, Japan

[73] Assignee: Seiko Epson Corporation, Tokyo, Japan

[21] Appl. No.: 663,757

[22] Filed: Mar. 1, 1991

Related U.S. Application Data

[63] Continuation of Ser. No. 534,692, Jun. 7, 1990, abandoned.

[30] Foreign Application Priority Data

| Jun. 14, 1989 | [JP] | Japan | 1-151695 |
| Aug. 29, 1989 | [JP] | Japan | 1-222029 |
| Aug. 29, 1989 | [JP] | Japan | 1-222030 |
| Mar. 24, 1990 | [JP] | Japan | 2-74140 |

[51] Int. Cl.$^5$ .......................... H03B 5/32; H03L 1/00; H03L 3/00
[52] U.S. Cl. .......................... 331/46; 331/49; 331/57; 331/158; 331/185; 331/186
[58] Field of Search ............ 331/46, 49, 185, 186, 331/158

[56] References Cited

U.S. PATENT DOCUMENTS

| 3,328,718 | 6/1967 | Murray | 331/186 X |
| 3,546,626 | 12/1970 | McGhee | 331/186 X |
| 4,001,664 | 1/1977 | Hyltin | 363/59 |
| 4,254,492 | 3/1981 | McDermott, III | 331/49 X |

FOREIGN PATENT DOCUMENTS 60-27206  2/1985  Japan .......................... 331/46

Primary Examiner—Siegfried H. Grimm
Attorney, Agent, or Firm—W. Douglas Carothers, Jr.

[57] ABSTRACT

A semiconductor integrated circuit device comprises a first oscillator circuit driven by a first voltage for generating a first clock signal employed as the internal system clock signal for an internal circuit in the integrated circuit device and a second oscillator circuit driven by a second voltage lower than said first voltage for generating a second clock signal. A voltage boost circuit generates a stepped up voltage based on the second clock signal, which stepped up voltage is higher than the first voltage and is supplied to the first oscillator circuit and the internal circuit as their circuit source voltage. In another embodiment, an oscillation detecting circuit detects whether or not the first oscillator circuit is in an oscillating or non-oscillating state and, then, generates a clock selection control signal of a first type when the first oscillator circuit is in a non-oscillating state and generates a clock selection control signal of a second type when the first oscillator circuit is in an oscillating state. A clock signal selecting circuit is connected to receive either the first type or the second type clock selection control signal for respectively selecting either the second or the first clock signal for output. The oscillation detecting circuit is adapted to cease the oscillation of the second oscillator circuit when the first oscillator circuit is in its oscillating state.

27 Claims, 10 Drawing Sheets

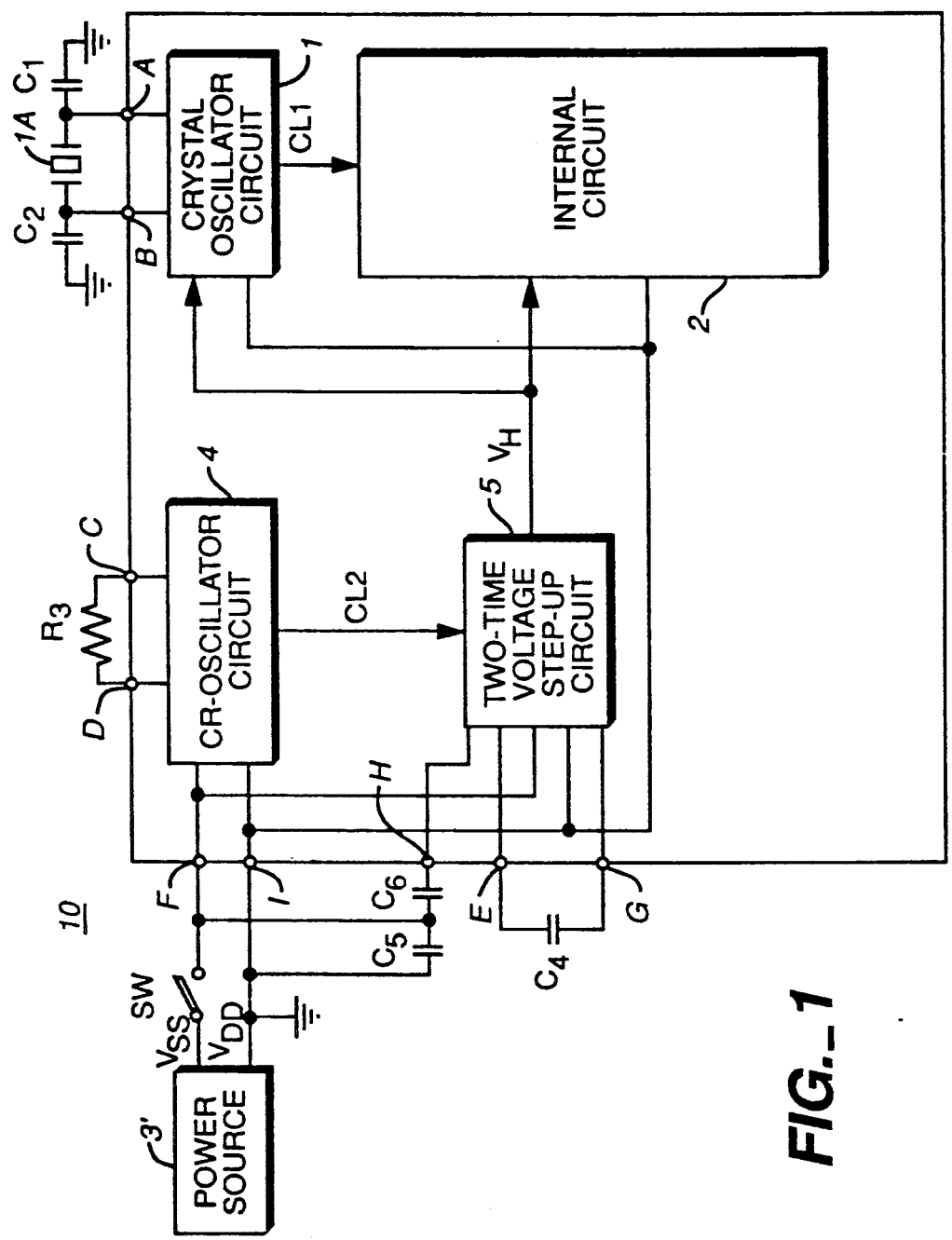
FIG._1

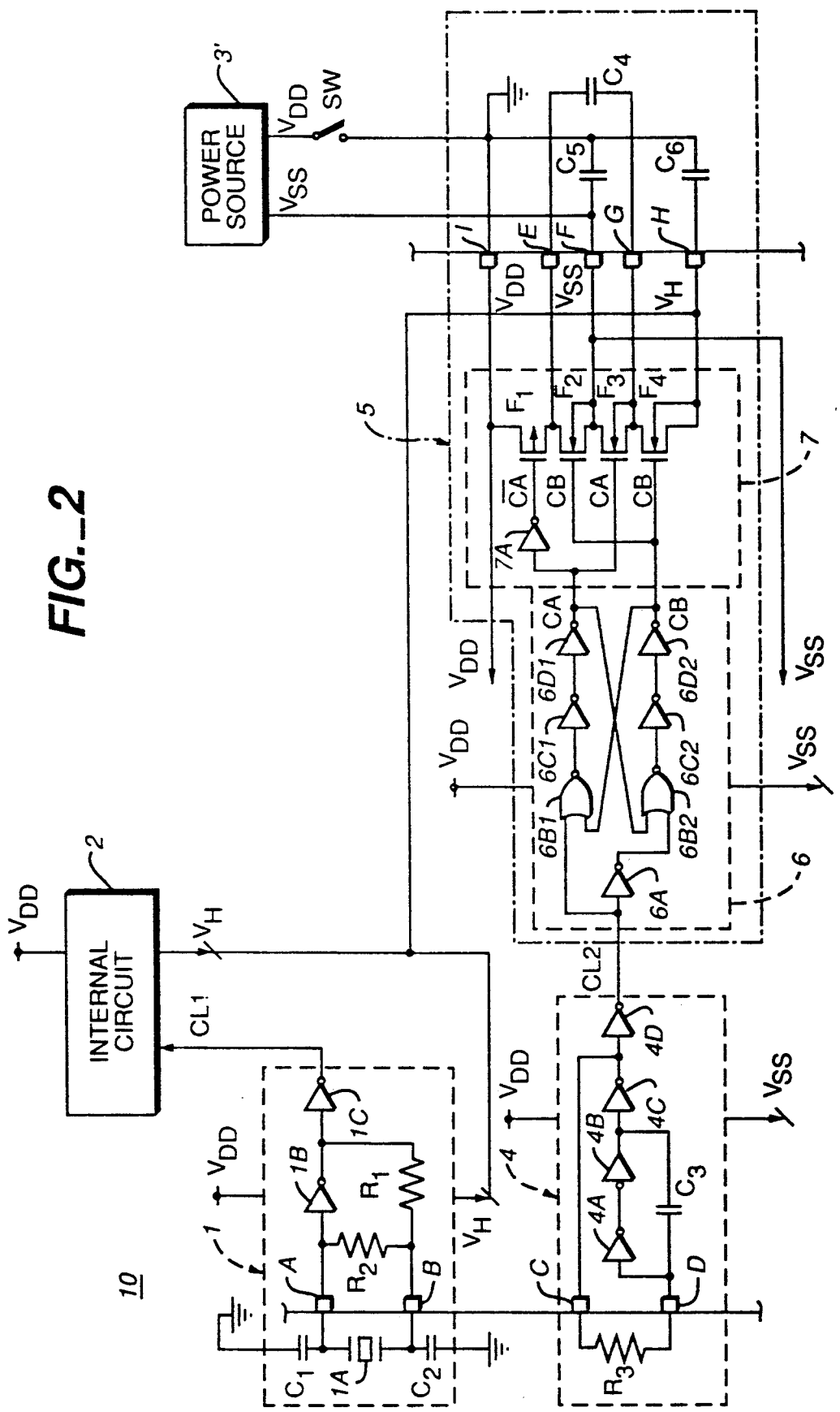
FIG._2

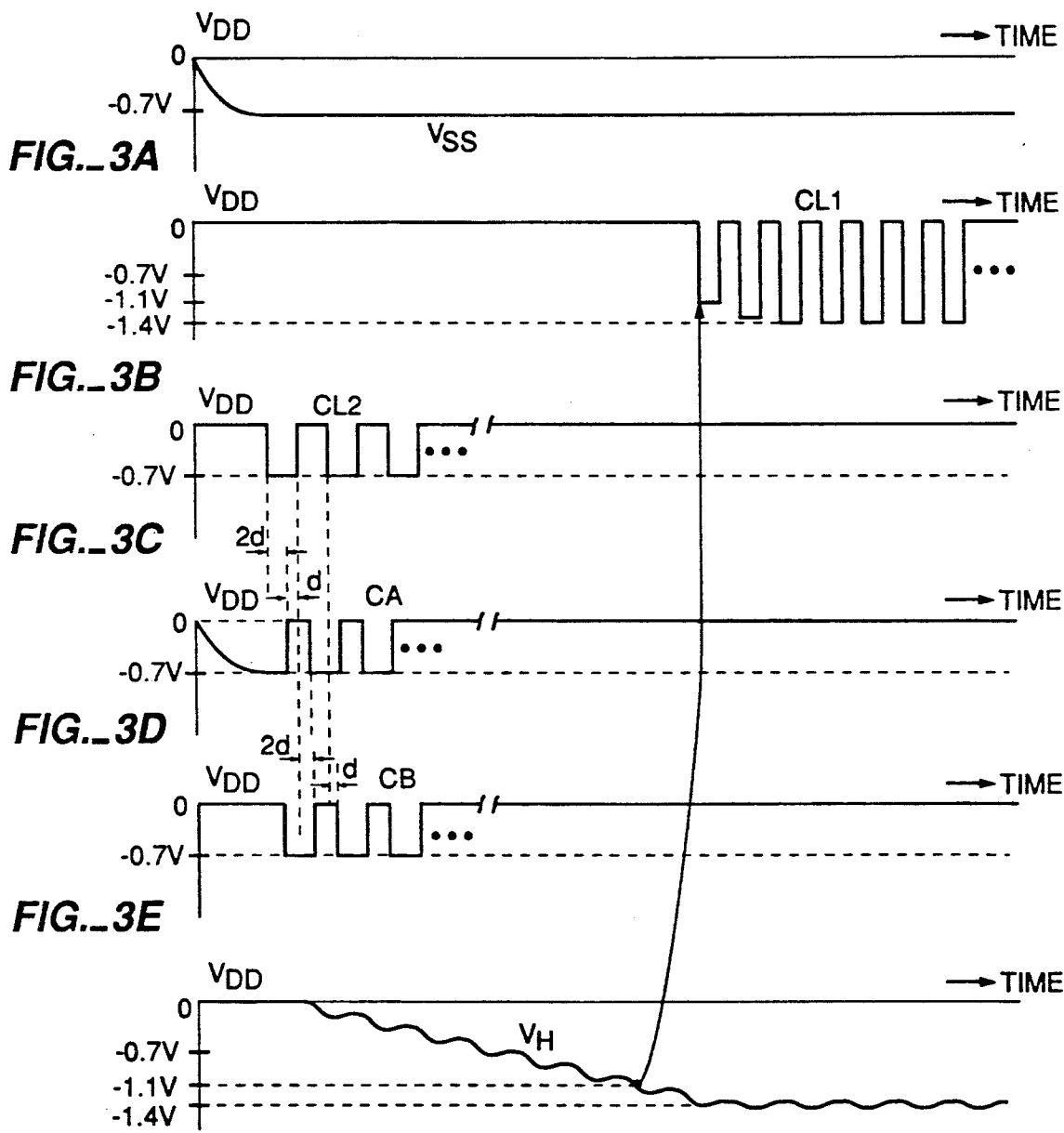

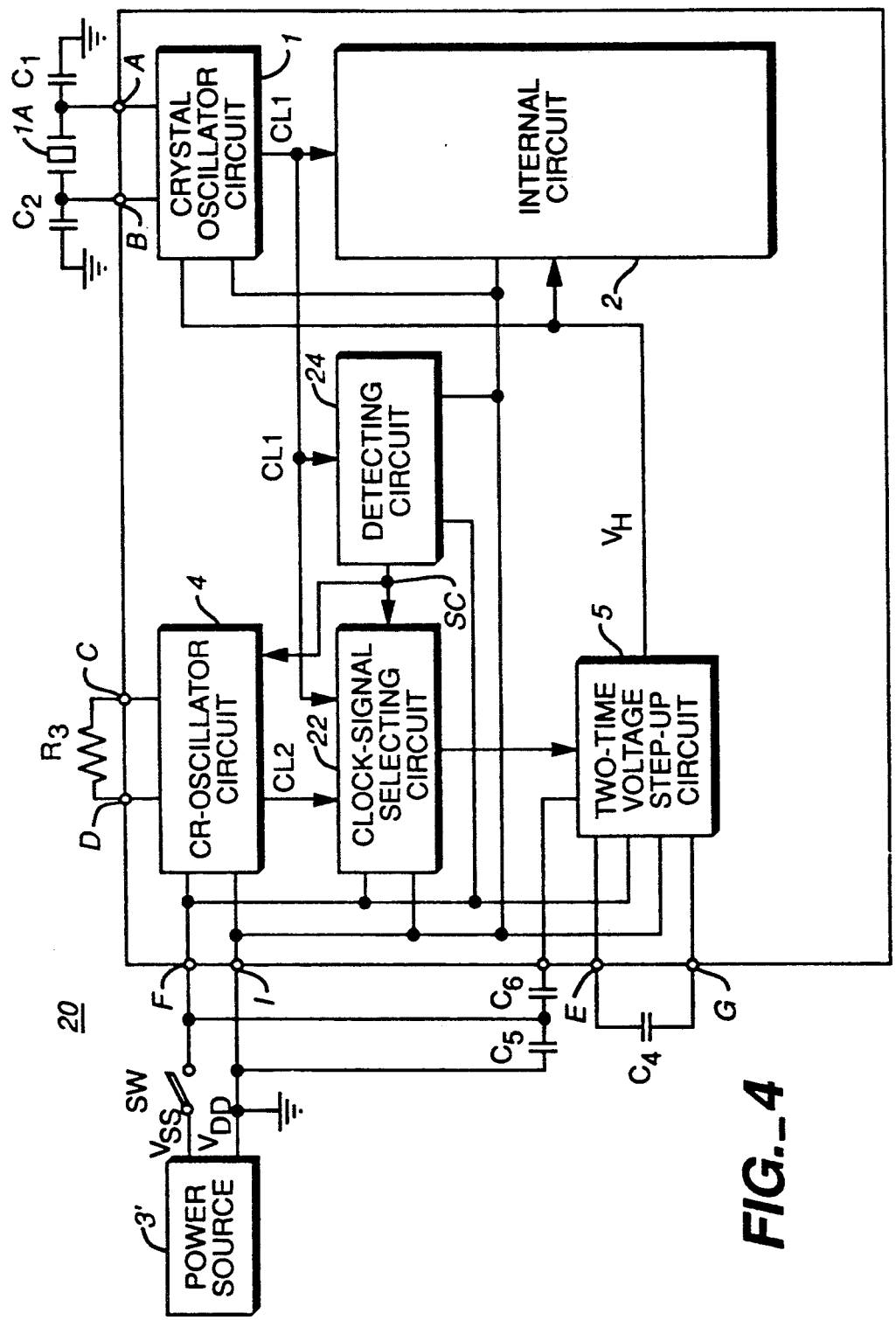
FIG._4

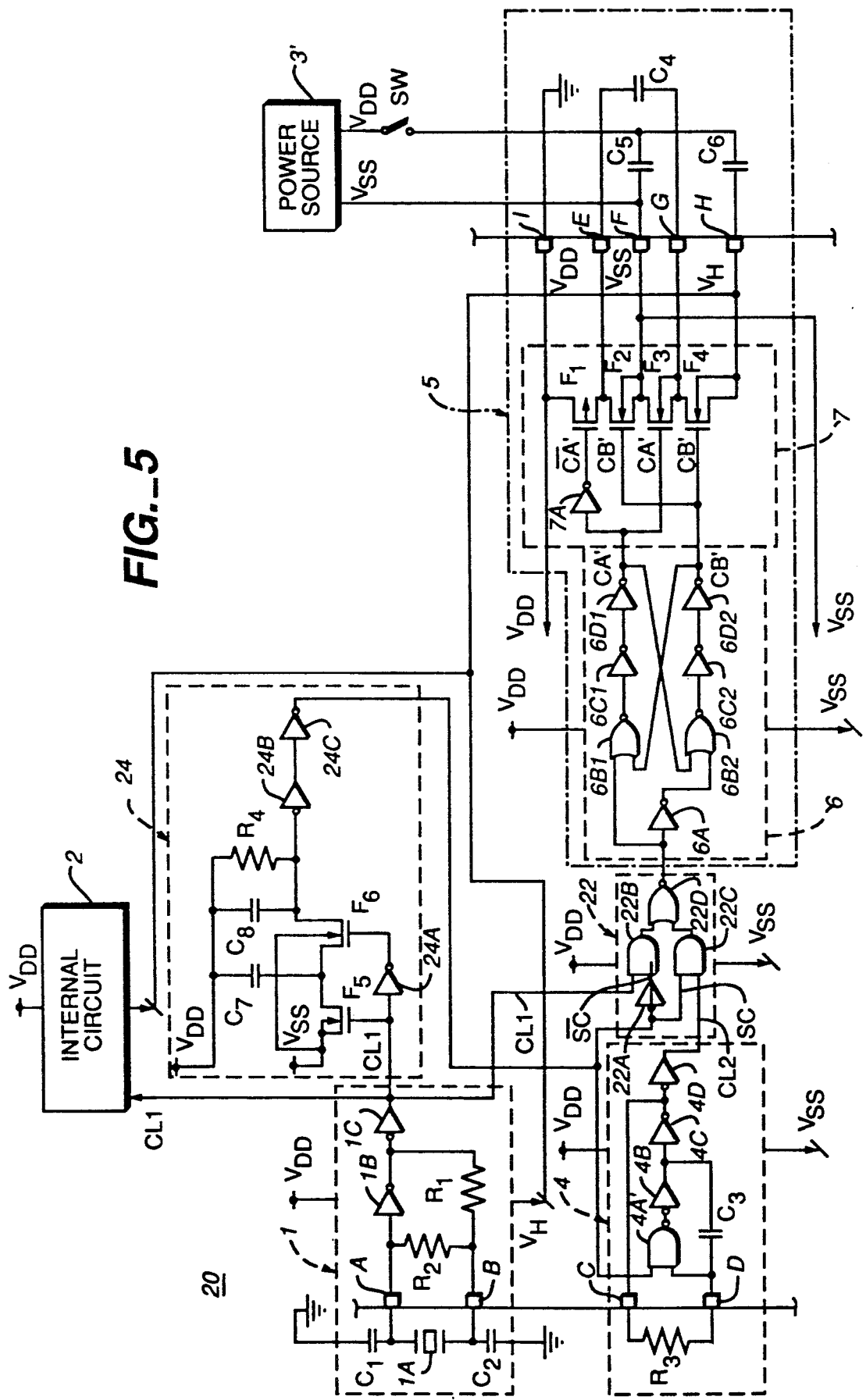
FIG._5

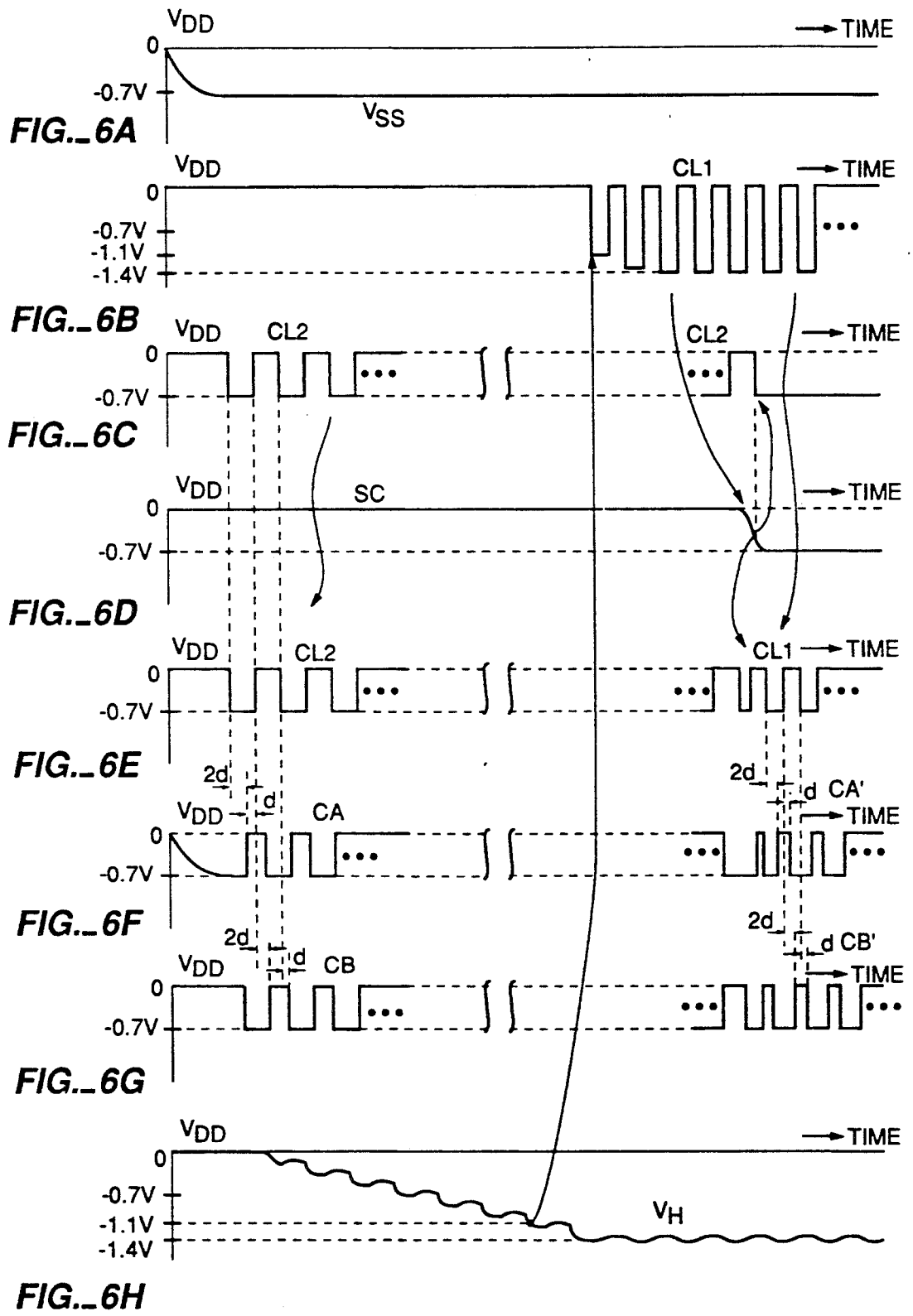

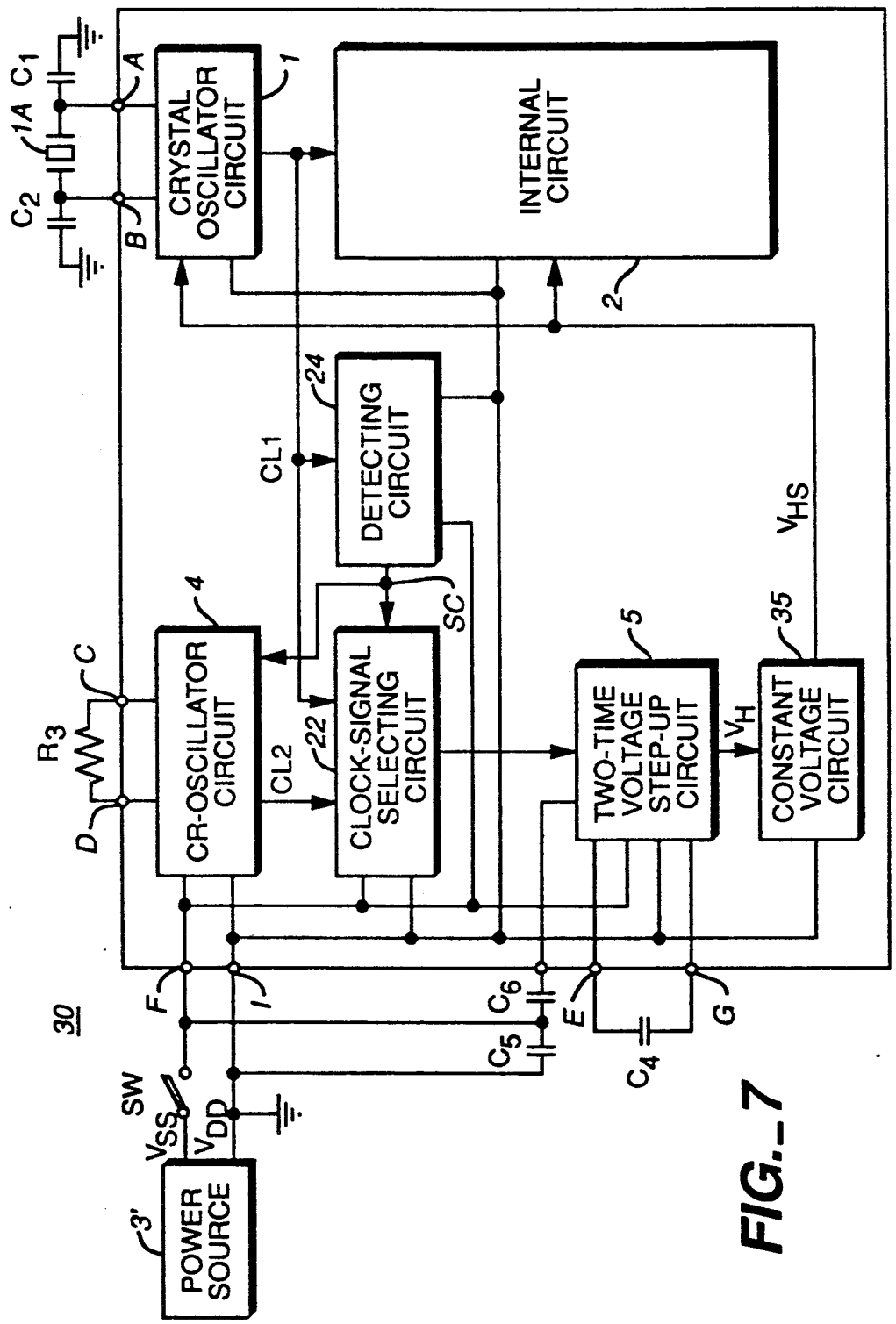
FIG._7

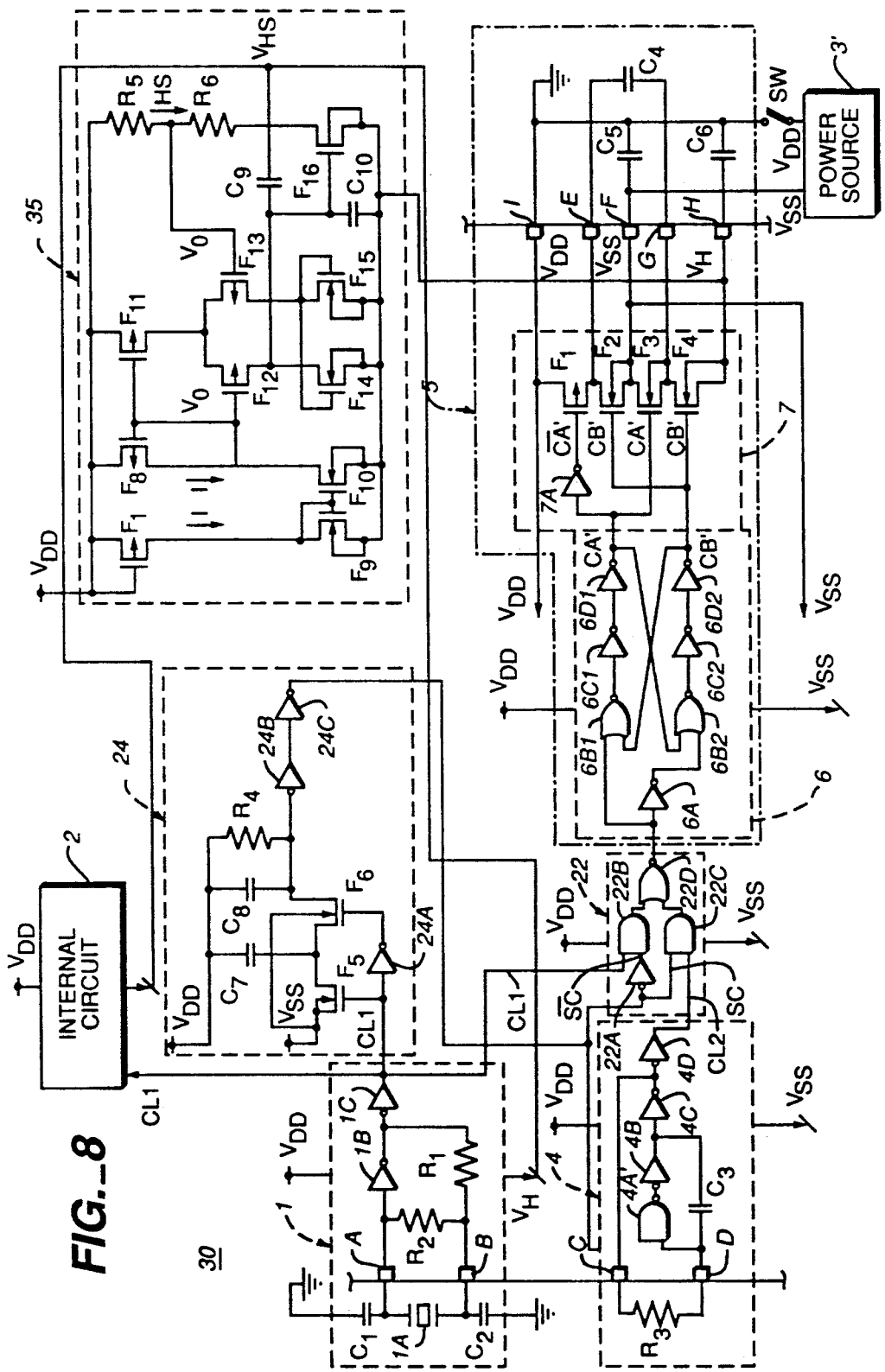
FIG._8

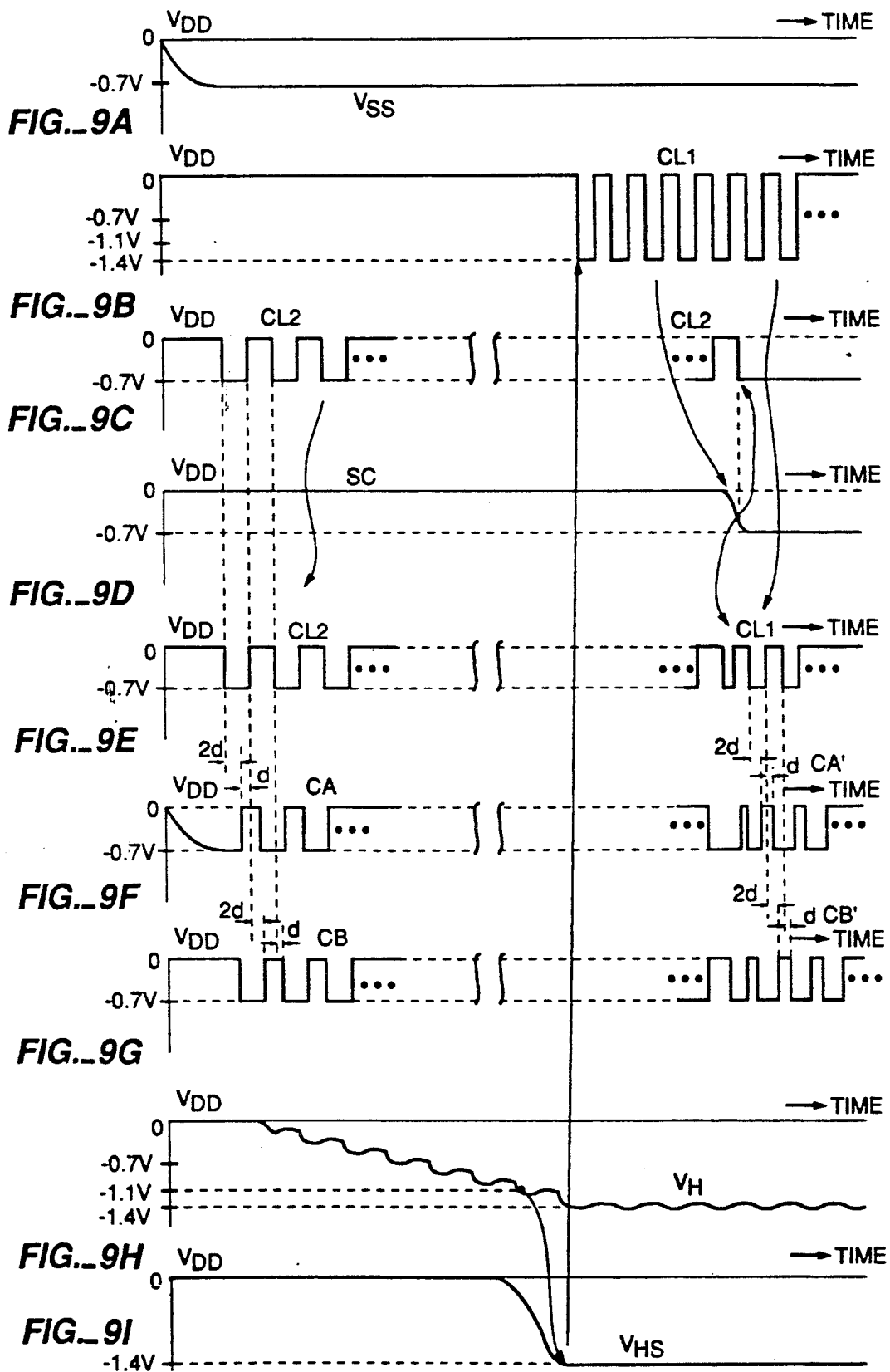

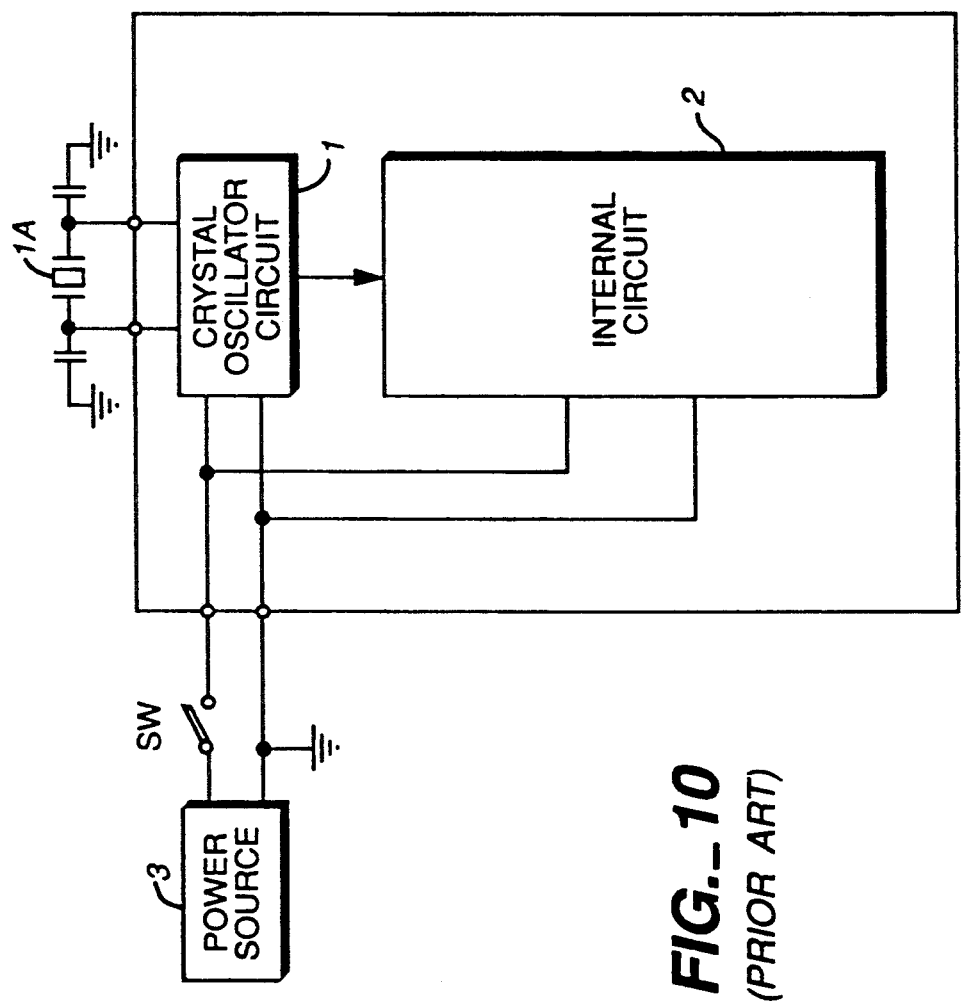
FIG._10 (PRIOR ART)

SEMICONDUCTOR INTEGRATED CIRCUIT DEVICE OPERATED WITH AN APPLIED VOLTAGE LOWER THAN REQUIRED BY ITS CLOCK OSCILLATOR

This is a continuation of copending application Ser. No. 07/534,692 file Jun. 7, 1990 and now abandoned.

BACKGROUND OF THE INVENTION

This invention relates generally to a semiconductor integrated circuit device having a piezoelectric type oscillator, such as, a crystal or ceramic oscillator, which have a high stability in terms of oscillation frequency and more particularly pertains to a semiconductor integrated circuit device having a piezoelectric type oscillator which properly drives the piezoelectric oscillator and internal circuitry through the application of a voltage lower than the voltage required for oscillation of the piezoelectric type oscillator.

In the field of semiconductor integrated circuits, clock signal generators of the type having a piezoelectric type oscillator, such as, a crystal or ceramic oscillator, have been widely utilized due to their superior stability in terms of oscillation frequency. For example, crystal oscillator circuits generally exhibit of frequency stability of $10^{-5}$ or greater. While CR oscillator circuits have also been widely utilized, they generally exhibit lower freqeuncy stability. Therefore, sophisticated semiconductor circuits, such as, microprocesors, are usually employed together with the piezoelectric type oscillator.

A typical 4 bit microprocessor semiconductor integrated circuit unit is illustrated in FIG. 10 and comprises a crystal oscillator circuit 1 provided with an external crystal resonator 1A having a characteristic frequency of approximately 32.768 KHz and an internal circuit 2 comprising a centrl processing unit and the like. Internal circuit 2 utilizes clock signals generated by crystal osicllator circuit 1 as internal system clock signals. Circuit 2 is provided with current from external power source 3 through a power switch SW. Power source 3 must have a voltage level sufficiently high to permit crystal oscillator circuit 1 to properly oscillate. As an example, crystal oscillator circuit 1 is driven to oscillate with a voltage of about 1.1 V. Thus, external power source 3 must have a voltage level of 1.1 V or higher. In addition, the internal circuits in semiconductor integrated circuit 2 must be provided with a sufficiently high voltage for proper operation, which is usually higher than 1.1 V.

An object of this invention is to provide a semiconductor integrated circuit having an oscillator circuit wherein the semiconductor integrated circuit can be operated with an applied voltage lower than the voltage required for operating the oscillator circuit.

SUMMARY OF THE INVENITON

According to this invention, a semiconductor integrated circuit device comprises a first oscillator circuit driven by a first voltage for generating a first clock signal employed as the internal system clock signal for an internal circuit in the integrated circuit device and a second oscillator circuit driven by a second voltage lower than said first voltage for generating a second clock signal. A voltage boost circuit generates a stepped up voltage based on the second clock signal, which stepped up voltage is higher than the first voltage and is supplied to the first oscillator circuit and the internal circuit as their circuit source voltage. In another embodiment, an oscillation detecting circuit detects whether or not the first oscillator circuit is in an oscillating or non-oscillating state and, then, generates a clock selection control signal of a first type when the first oscillator circuit is in a non-oscillating state and generates a clock selection control signal of a second type when the first oscillator circuit is in an oscillating state. A clock signal selecting circuit is connected to receive either the first type or the second type clock selection control signal for respectively selecting either the second or the first clock signal for output. The oscillation detecting circuit is adapted to cease the oscillation of the second oscillator circuit when the first oscillatoir circuit is in its oscillating state. In a further embodiment, a constant voltage circuit receives the stepped up voltage from the voltage boost circuit and converts the stepped up voltage to a constant voltage and the constant voltage is supplied to the first oscillator circuit and the internal circuit as their circuit source voltage.

According to one aspect of the present invention, a semiconductor integrated circuit comprises an external crystal oscillator circuit having a piezoelectric type resonator, such as, a crystal or ceramic resonator, driven into oscillation by application of a voltage of a first level, for example, 1.1 V or higher, and generates first clock signal employed as an internal system clock signal. The semiconductor integrated circuit further includes a low voltage driven oscillator circuit, driven into oscillation by application by a second voltage, for example, 0.7 V or higher, wherein the second voltage is lower than the first above mentioned voltage and generates a second clock signal. A voltage step-up or boost circuit, such as, a multiple rectifying circuit, generates a stepped up voltage higher than the first above mentioned voltage based upon the second clock signal provided from the low voltage driven oscillator circuit and the stepped up voltage is supplied to both the crystal oscillator circuit and the internal circuits of the semiconductor integrated circuit as their applied circuit source voltages.

Thus, according to this invention, an external source voltage can be adopted whose value is between the first and second voltages. With the supply of the external source voltage to the semiconductor integrated circuit of the present invention, only the low voltage driven type oscillator circuit begins oscillation to generate the second clock signal which is fed to the voltage step-up circuit, whereas the the crystal oscillator circuit having the piezoelectric resonator is stopped in the non-oscillating condition. The voltage boost circuit provided with the second clock signal generates a stepped-up voltage equal to or higher than the first voltage, which is then supplied to the crystal oscillator circuit and the internal circuit as their source voltage. Thus, the crystal oscillator circuit is driven to commence oscillation to thereby produce the first clock signal which is fed to the internal circuit. The internal circuitry has been applied with the step-up voltage and performs desired functional operations in response to the first clock signal. Thus, according to the present invention, a source voltage, whose value is below the first above mentioned voltage, permits the crystal oscillator circuit to oscillate thereby saving in the amount of voltage requirements, which is particularly important in the case where a battery is employed as the source voltage to provided for extended battery usage. Further, the internal circuit is also supplied with a sufficient voltage so that it is assured of operating properly even if the external source voltage is low.

It should be noted that the second clock signal from the low voltage driven oscillator circuit is not utilized as the internal system clock signal but is utilized as an alternating voltage or switching control signal for the voltage step-up or boost circuit. In contrast, the first clock signal from the crystal oscillator circuit is utilized as the internal system clock signal and not as the power source for the internal circuit.

Relative to the above described semiconductor integrated circuit, even after the crystal oscillator circuit commences oscillation, if th low voltage driven oscillator circuit continues oscillation which brings about a large consumption of effective source power. The consumption of the power by the low voltage driven oscillator circuit cannot be ignored especially in the case where a battery is provided as the source power. Thus, it is undersirable to operate concurrently both oscillators due to the waste of current consumption. Also, if the oscillation of both is continued, the coupling of capacitance will occur if the signal lines of both oscillator circuits are adjacent to one another. This coupling of capacitance affects the crystal oscillator circuit iun the form of noise or can bring about a resonant frequency situation.

Furthermore, the crystal oscillator has harmonic frequencies as well as its chracteristics frequency and the harmonic frequencies appear at times as much as the characteristic frequency. Thus, there is the concern that turned oscillations or noise will appear at unexpected frequencies during continuous frequency oscillating of both the crystal and low voltage driven oscillator circuits which may result in deterioration of the oscillation stability of the crystal oscillator circuit or the source voltage. Also, when the power line of both oscillator circuits is common and the voltage of the power line fluctuates due to the lower voltage driven oscillator circuit, the crystal oscillator circuit, per se, is affected and stable frequencies can not be achieved from the crystal oscillator cicuit. Thus, according to another aspect of the present invention, the above described semiconductor integrated circuit further compriese a clock selecting which is provided at its imput with a bi-level clock selection control signal and, based on the state of this signal, selection of either the first or the second clock signals is made and provided as an output. An oscillation detecting circuit determines, directly or indirectly, whether the crystal oscillator circuit is in its oscillating or non-oscillating state. The oscillation detecting circuit sets its mode of operation in a secon mode which is selective of the second clock signal if the crystal oscillator circuit is in its non-oscillating state or sets its mode in a first mode which is selective of the first clock signal and for stopping the oscillations of the low voltage driven type oscillator circuit if the crystal oscillator circuit is in its oscillating state. As a result, concurrent oscillation of both oscillator circuits is avoided to prevent the foregoing mentioned problems. In any case, a voltage step-up or boost circuit is provided with the selected clock signal and generates a stepped up voltage equal to or higher than the first voltage.

In a further embodiment of the present invenrin, a constant voltage circuit is provided to stabilize the stepped up voltge. The stabilized voltage is then provided to the crystal oscillator circuit and the internal circuit of the semiconductor integrated circuit device. Thus, according to the present invention, when the first clock signal is generated by the crystal oscillator circuit, it is detected by the oscillation detecting circuit. As a result, the oscillation detecting circuit produces the clock selection control signal which is provided to the clock signal selecting circut. In response to the clock selecting signal, the clock signal selecting circuit sets its mode for receiving the first clock signal and supplies the first clock signal to the voltage boost circuit. Concurrently, the clock signal selecting circuit generates and oscillation termination signal which is provided to the low voltage driven oscillator circuit in order to terminate its functional operation. Thus, the low voltage driven oscillator circuit is exclusively utilized only for raising the source voltage at the initial stage of circuit operation and, therefore, the consumption of the source voltage by the low voltage driven oscillator circuit is eliminated after the crystal oscillator circuit begins oscillator functioning thereby prolonging the life time of the source voltage, such as, a battery. In addition, as previously indicated, the concurrent oscillation of both the crystal and low voltage dirven oscillator circuits is avoided so that an accurate clock signal can be produced.

Generally, the voltage boost circuit generates a stepped up voltage that includes an accompanying ripple. However, the ripple can be eliminated by passing the stepped up voltage through a constant voltage circuit. Therefore, the crystal oscillator circuit and internal circuit are driven by means of a stable constant voltage resulting in enhanced operational stability.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a block circuit diagram of a first embodiment of this invention for a semiconductor integrted circuit comprising a 4 bit microprocessor unit.

FIG. 2 is a detailed schematic diagram of the circuit shown in FIG. 1.

FIGS. 3A-3F are diagrams of waveforms of clock and control signals in the circuit of FIG. 1.

FIG. 4 is a block circuit diagram of a second embodiment of this invention for a semiconductor integrated comprising a 4 bit microprocessor unit.

FIG. 5 is a detailed schematic diagram of the circuit shown in FIG. 4.

FIGS. 6A-6H are diagrams of waveforms of clock and control signals in the circuit of FIG. 4.

FIG. 7 is a block circuit diagram of a third embodiment of this invention for a semiconductor integrated circuit comprising a 4 bit microprocessor unit.

FIG. 8 is detailed schematic diagram of the circuit shown in FIG. 7.

FIGS. 9A-9I are diagrams of waveforms of clock and control signals in the circuit oif FIG. 7.

FIG. 10 is a block circuit diagram of a conventional semiconductor integrated circuit employing a crystal oscillator circuit.

DESCRIPTION OF THE PREFERRED EMBODIMENTS

Reference is now made to FIGS. 1 and 2 wherein there is illustrated a first embodiment of this invention for a semiconductor integrated circuit comprising a 4 bit microprocessor unit. Four bit microprocessor unit (MPU) 10 generally comprises crystal oscillator circuit 1, internal circuit 2, CR-oscillator circuit 4 and two time voltage step-up circuits 5. Crystal oscillator circuit 1 is provided with external crystal resonator 1A which has a characteristic frequency of 32.768 KHz. Crystal oscillator 1 is supplied with a voltage defined as stepped-up potential $V_H$, which is negative with respect to ground or reference potential, and is generated by two time voltage step-up circuit 5. Crystal oscillator circuit 1 generates clock signal, CL1, having a frequency of 32.768 KHz which is supplied as an internal system clock signal to internal circuit 2 of MPU 10.

As shown in FIG. 2, crystal oscillator circuit 1 comprises inverter 1B, feedback resistors $R_1$ and $R_2$ connected parallel to inverter 1B, external crystal resonator 1A connected across terminals A and B to be connected in parallel with resistor $R_2$, noise eliminating capacitors $C_1$ and $C_2$, each connected between the respective poles of crystal resonator 1A and ground or reference potential, and buffer inverter 1C connected in series with the output of inverter 1B. CR oscilltor circuit 4 comprises series connected inverters 4A, 4B and 4C forming an amplifier, internal capacitor $C_3$ and external resistor $R_3$ across terminals C and D for providing a phase shift circuit of th* parallel C type or a feedback circuit and buffer inverter 4D. CR oscillator circuit 4 is energized by either a high potential $V_{DD}$, such as a reference potential of about $-0.7$ V, with the application of voltage of 0.7 V from low voltage source 3' to the MPU 10 upon closing power switch SW.

Two time voltage step-up circuit 5 comprises two phase clock generating circuit 6, switching circuit 7, exernal charge inducing capacitor $C_4$ connected to terminals E andG, external voltage stabilizing capacitor $C_5$ connected between terminal F applied with low potential, $V_{SS}$, and power switch SW, and external charging capacitor $C_6$ connected between terminal H applied with the stepped-up potential, $V_{DD}$, and power switch SW.

Two phase clock generating circuit 6 comprises inverter 6A for inverting the clock signal fro CR oscillator circuit 4, NOR gates 6B1 and 6B2 consituting an RS flip flop and delaying inverters 6C1, 6C2, 6D1 and 6D2 producing at the respective outputs of inverters 6D1 and 6D2 clock signals CA and CB.

In switching circuit 7, P channel insulated gate field effect transistor $F_1$ andN channel insulated gate field effect transistors (MOSFETs) $F_2$, $F_3$ and $F_4$ are connected in series between terminal I, to which is applied high potential, $V_{DD}$, and terminal H, to which is applied stepped-up voltage, $V_H$. Transistor $F_1$ is supplied at its gate with inverted clock signal CA from two phase clock generating circuit 6 via inverter 7A. Transistor $F_3$ is supplied at its gate with clock signal CA. Transistors $F_2$ and $F_4$ are provided at their gates with other clock signal CB.

In operation, MPU 10 is connected to low voltage source 3' of 0.7 V when power switch Sw is closed. As shown in FIG. 3A, upon closing of switch SW, the negative potential of $V_{SS}$ drops from zero potential of $V_{DD}$ to $-0.7$ V and settles to an remains at a constant voltage. With the application of this low voltage to CR oscillator circuit 4, circuit 4 commences oscillation to generating at its output clock signal, CL2, having the logic amplitude of 0.7 V, as indicated in FIG. 3C. It should be noted that oscillator circuit 1 is still in its non-oscillating state and clock signal, CL1, has not yet been produced from circuit 1, as indicated from FIG. 3B. As shown in FIG. 3D, two phase clock generating circuit 6, in response to clock signal, CL2, generates clock signal, CA, with a trailing edge dropping to the $-0.7$ V level after a delayed amount, $1d$, from the leading edge of clock signal, CL2, rising to the reference level, while the leading edge of clock signal, CA, rises to the reference (0 V) level after a delayed amount, $2d$, from the trailing edge of clock signal, CL2, dropping to the $-0.7$ V level. As shown in FIG. 3E, two phase clock generating circuit 6, in response to clock signal, CL2, generates clock signal, CB, with a trailing edge dropping to the $-0.7$ V level after a delayed amount, $1d$, from the trailing edge of clock signal, CL2, having dropped to the $-0.7$ V level, while the leading edge of clock signal, CB, rises to the reference level after a delayed amount, $2d$, from the leading edge of clock signal, CL2, rising to the reference level. The delayed time periods of $2d$ and $1d$ are defined by the combination of the response delay times produced by inverters 6C1, 6D1, 6C2 and 6D2.

In switching circuit 7, inverted clock signal CA is applied to the gate of transistor $F_1$ while clock signal CB is applied to the gates of transistors $F_2$ and $F_4$ and clock signal CA is applied to the gate of transistor $F_3$. When clock signal CA is logically high (0 V) and the inverted clock signal, CA, logically low ($-0.7$ V), both transistors $F_1$ and $F_3$ are in their ON state to allow capacitor $C_4$ to be charged with source voltage, $-V_{SS}$ (equal to $V_{DD}-V_{SS}$). During this charging period, the voltage at terminal G rises in the negative direction according to the time constant of the RC circuit comprising capacitor $C_4$ and the ON resistance of the series connection of transistors $F_1$ and $F_3$. On the other hand, when clock signal CA is logically low ($-0.7$ V) and signal CB is logically high (0 V), transistors $F_1$ and $F_3$ are placed in their OFF states while transistors $F_2$ and $F_4$ are placed in their ON states. With transistor $F_2$ in its ON state, the positive voltage on capacitor $C_4$ becomes lower. With transistor $F_4$ in its ON state, the negative voltage ($<V_{SS}$) of capacitor $C_4$ is applied to terminal H to thereby start the charging of capacitor $C_6$. During the time period wherein clock signal CB is logically high, the electrical charge of capacitor $C_4$ is induced into capacitor $C_6$, and voltage $V_H$ at terminal H rises in a negative direction. Thus, transistors $F_1$ and $F_3$ are controlled to be repeatedly in an ON/OFF condition, together with transistors $F_2$ and $F_4$ being in an OFF-/ON condition. As a result, the amount of charge on capacitor $C_6$ gradually increases and voltage $V_H$ at terminal H continually rises along a line indicated in FIG. 3F and reaches a sustained value of $-1.4$ V, which value is twice as much as the value of the source voltage, i.e., 0.7 V.

During the course of the gradual rise of voltage, $V_H$, at terminal H, when $V_H$ exceeds $-1.1$ V, crystal oscillator circuit 1 will begin oscillations as shown in FIG. 3B, and oscillating clock signal, CL1, is thereafter supplied to internal circuit 2. Internal circuit 2, which is also provided with the source voltage of 1.4 V, is thereafter placed into its operational state.

As previously indicated, according to the present embodiment of this invention, the source voltage of 0.7 V from voltage source from power source 3' may be utilized as the external source voltage for oscillating crystal oscillator circuit 1, which is driven into oscillation by a voltage of 1.1 V or higher. In addition, where the source voltage of 1.1 V or higher is utilized as in the conventional device, even if the voltage falls, the oscillatory function of crystal oscillator circuit 1 can be maintained until the voltage falls below 0.7 V.

In the above embodiment, even after crystal oscillator circuit 1 commences oscillation, CR oscillator circuit 4 continues oscillation and clock signal, CL2, from CR oscillator circuit 4 is utilized in switching circuit 7 for control signals or gate signals. However, once crystal oscillator circuit 2 commences oscillator functioning, clock signal, CL1, generated from crystal oscillator circuit 1 can be utilized in place of clock signal, CL2.

FIGS. 4 and 5 disclose a second embodiment of this invention wherein components corresponding to components in the first embodiment of FIGS. 1 and 2 and denoted by the same reference numerals therein function in the same manner as previous explained relative to these components in the first embodiment. The second embodiment in FIG. 4 differs from FIG. 1 in the addition of clock signal selecting circuit 22 and oscillation detecting circuit 24.

Clock signal selecting circuit 22 selects either clock signal, CL2, from CR oscillator circuit 4 or clock signal, CL1, from crystal oscillator circuit 1 in response to a clock selection control signal, as explained in more detail below, and passes the selected clock signal to two time voltage step-up circuit 5. Oscillation detecting circuit 24 determines if crystal oscillator circuit 1 is in its oscillating state and generates (1) the clock selection control signal for selecting clock signal, CL2, if crystal oscillator circuit 1 is detected to be in its non-oscillating state or (2) the clock selection control signal for selecting clock signal, CL1, if crystal oscillator circuit 1 is detected to be in its oscillating state and ceases the oscillatory functioning of CR oscillator circuit 4.

As shown in FIG. 5, oscillation detecting circuit 24 comprises inverter 24A for receiving and inverting the output of crystal oscillator circuit 1, N channel isolated gate field effect transistors $F_5$ and $F_6$ which are connected in series with each other and respectively receive at their gates the input and output of inverter 24A, capacitor $C_7$ connected between the voltage, $V_{DD}$, and the drain of transistor $F_5$, capacitor $C_8$ and resistor $R_4$ connected in parallel and connected between the voltage, $V_{DD}$, and the drain of transistor $F_6$, and inverters 24B and 24C which are connected in series and to the drain of transistor $F_6$. The output of inverter 24C is control signal, SC.

In order to provide for means for terminating the oscillation of CR oscillator circuit 4, NAND gate 4A' is installed in circuit 4 in place of inverter 4A of RC oscillator circuit 4 of FIG. 2 and clock selection control signal SC, from oscillation detecting circuit 24 is an input to NAND gate 4A' as well as to clock signal selecting circuit 22.

Clock signal selecting circuit 22 is a combination gate circuit and comprises AND gate 22B with its inputs consisting of clock signal, CL1, from crystal oscillator circuit 1 and inverted control signal, SC, from oscillation detecting circuit 24 via inverter 22A, AND gate 22C with its inputs consisting of clock signal, CL2, from CR oscillator circuit 4 and control signal, SC, from oscillation detecting circuit 24 and NOR gate 22D whose inputs are supplied are the respective outputs from AND gates 22B and 22C.

In operation, after the source voltage 3' is applied to the MPU, the source voltage, $-V_{SS}$, reaches the value of $-0.7$ V, as shown in FIG. 6A, and clock signal, CL2, is generated, as shown in FIG. 6C. Crystal oscillator circuit 1 is still in its non-oscillating state and clock signal, CL1, has not yet been produced from circuit 1, as indicated from FIG. 6B. Thus, transistor $F_5$ of oscillation detecting circuit 24 is maintained in its OFF state and the input of inverter 24B is pulled up to the level of voltage $V_{DD}$. As a result, clock selection control signal SC is set at a 1 or logically high level (0 V), as indicated in FIG. 6D, which means that the selection mode is set for selecting clock signal, CL2. In this selection mode, clock signal selecting circuit 22 selects clock signal, CL2, and supplies signal, CL2, to two time voltage step-up circuit 5, as indicated in FIG. 6E. Two phase clock signal generating circuit 6 generates clock signals, CA and CB, as shown in the left portion of FIGS. 6F and 6G, and stepped-up voltage, $V_H$, of $-1.1$ V or higher is supplied to crystal oscillator circuit 1 and internal circuit 2 in the same manner as explained previously in connection with the first embodiment of FIGS. 1 and 2 and crystal oscillator circuit 1 thereafter generates clock signal, CL1, which is supplied to internal circuit 2.

Clock signal, CL1, is also supplied as an input to oscillation detecting circuit 24 and transistors $F_5$ and $F_6$ of circuit 24 are alternately placed in their ON and OFF states whereby capacitors $C_7$ and $C_8$ are gradually charged and clock selection control signal, SC, reverts to a voltage level of $-0.7$ ($V_{SS}$). Clock selection control signal, SC, having at this time a $-0.7$ ($V_{SS}$), or logically low level means that the selection mode is set for selecting clock signal, CL1, (right portion of FIG. 6B) via clock signal selecting circuit 22. Signal, SC, is supplied to the NAND gate 4A' of crystal oscillation circuit 4 and, as a result, CR oscillator circuit 4 ceases its oscillation, as indicated in the right portion of FIG. 6C. At the same time, clock signal selecting circuit 22 selects clock signal, CL1, (right portion of FIG. 6E), which is supplied to two time voltage step-up circuit 5. In response to clock signal, CL1, two phase clock signal generating circuit 6 generates clock pulses CA' and CB', shown in the right hand portions of FIGS. 6F and 6G, from which switching circuit 7 is driven to produce the stepped-up voltage, $V_H$.

Accordingly, in the second embodiment of FIGS. 5 and 6, after clock signal CL1 is generated, switching circuit 7 is driven by clock pulses CA' and CB' produced by clock signal CL1, so that the oscillatory functioning of CR oscillator circuit 4 is no longer required. Thus, source voltage 3' can be saved or spared by the amount of voltage required for driving CR oscillator circuit 4.

In addition, the concurrent oscillatory functioning of the two oscillator circuits 1 and 4 can be avoided which provides for a lower consumption of power of supply voltage, which is particularly important where a battery is employed as the source voltage. Crystal oscillator circuit 1, which oscillates at a characteristic frequency, for example, of 32.768 KHz, is likely to also oscillate at harmonic frequencies at various undeterminable times which appear as much as the characteristic frequency. Also, oscillator circuit 1 oscillates to produce rectangular shape pulses which include large amounts of harmonic components. CR oscillator circuit 4 also produces harmonic components, other than clock signal, CL2. Therefore, the harmonic frequencies and harmonic components from crystal oscillator circuit 1 may be coherent with the harmonic components from CR oscillator circuit 4 via source lines and the like, which causes degradation of the stability of the source voltage. It is, of course, possible to add a bypass capacitor of small capacity in order to stabilize the source voltage. However, this is not desirable with a view toward the reduction in size of the semiconductor chip. Further, the source voltage for clock signal selecting circuit 22 and two time voltage step-up circuit 5 is 0.7 V and the on-voltage of the MOSFETs formed on the silicon semiconductor substrate is typically about 0.6 V so that the noise margin will be, at most, about 0.1 V. Therefore, it is desirable to terminate the oscillation of CR oscillator circuit 4, which is a noise forming source, after crystal oscillator circuit 1 commences oscillation.

In addition to eliminate this noise source, the noise margin of the logic amplitude may be expanded in order to assure the operational reliability of clock signal selecting circuit 22 and voltage step-up circuit 5. For example, the step-up voltage generated from voltage step-up circuit 5 may be utilized as the source voltage for clock signal selecting circuit 22 and voltage stepping-up circuit 5 so as to set the noise margin to be 0.5 V or more.

FIGS. 7 and 8 illustrate a third embodiment of this invention, wherein components corresponding to components in the first and second embodiments are denoted by the same reference numerals as in FIGS. 4 and 5 and, therefore, the previous description relative to the first and second embodiments is equally applicable to the third embodiment. MPU 30 of the third embodiment, however, includes constant voltage circuit 35 added to the arrangement of the second embodiment. Constant voltage circuit 35 is supplied with the stepped-up voltage $V_H$ generated from voltage step-up circuit 5. Constant voltage circuit 35 includes insulated gate field effect transistor $F_7$ of the depletion type and transistors $F_8$ through $F_{16}$ of the enhancement type. The respective pairs of transistors $F_7$ and $F_8$, $F_9$ and $F_{10}$, $F_{12}$ and $F_{13}$, $F_{14}$ and $F_{15}$ all have the same width and length channels. The difference in the threshold voltages between transistors $F_7$ and $F_8$ is determined by the difference in the density of ion implantation during fabrication.

Since transistors $F_9$ and $F_{10}$ are of the same conductive type and the same channel size as well as having the same applied gate voltage, currents, I, passing through these transistors are the same value. Transistor $F_7$, whose gate voltage is zero ($V_{DD}$), is of the depletion type and allows passage of the current therethrough, whereas transistor $F_8$ is of the enhancement type and its gate voltage is constant ($=V_0<0$). Transistors $F_{12}$ through $F_{15}$ comprise a current mirror circuit and the gate voltage of transistor $F_{13}$ is also $V_0$. Where the current passing through resistors $R_5$ and $R_6$ is defined by $I_{HS}$ and the output voltage by $V_{HS}$, the following equations are applicable:

$$-V_{HS} = (R_5 + R_6)I_{HS} \quad (1)$$

$$-V_0 = R_5 \cdot I_{HS} \quad (2)$$

Accordingly, $$V_{HS} = V_0(R_5 + R_6)/R_5 \quad (3)$$

Since the output voltage $V_{HS}$ is obtained by multiplying the constant voltage $V_0$ by a fixed number greater than one, the resultant value will be below $-1.4$ V. In the present embodiment, the constant voltage $V_{HS}$ is set to be about $-1.4$ V as indicated in FIG. 9I. The constant voltage $V_{HS}$, which is applied to both crystal oscillation circuit 1 and internal circuit 2, may also be applied to clock signal selecting circuit 22 and voltage step-up circuit 5, as indicated in FIG. 8.

With reference to the waveforms in FIG. 9, its can be seen that the operation of the third embodiment is generally the same as that of the second embodiment. Therefore, an explanation and description relative to the waveforms of FIG. 6 is equally applicable to the waveforms for FIG. 9. As the stepped-up voltage from voltage step-up circuit 5 increases per FIG. 9H, the constant voltage $V_{HS}$, indicated in FIG. 9I, rises until it reaches the level of $-1.4$ V and finally stabilizes at this level without any ripple. Therefore, crystal oscillator circuit 1 can be assured to operate in a stable condition and generated clock signal, CL1, has the logic amplitude of $V_{HS}$ immediately from the beginning of operation. In addition, the source voltage of internal circuit 2 is stabilized with $V_{HS}$, so that the operational reliability thereof is enhanced.

While the invention has been described in conjunction with several specific embodiments, it is evident to those skilled in the art that many further alternatives, modifications and variations will be apparent in light of the foregoing description. For example, the foregoing described three embodiments utilize two time voltage step-up circuit 5. Alternatively, a multiple voltage step-up circuit of three or four times, or the like, may be utilized. Crystal oscillator circuit 1 may use another type of piezoelectric resonator, such as, a ceramic resonator in place of crystal resonator 1A. Also, an LC oscillator circuit may be utilized instead of CR oscillator circuit 4 as the low voltage oscillator circuit. Further, in the described second and third embodiments, the oscillation of the crystal oscillator circuit is determined by directly detecting its output. Alternatively, indirect detection of the oscillator circuit may be utilized. For example, the stepped-up voltage from the voltage step-up circuit is monitored or instead the period of time from the beginning of the oscillation of the CR oscillator circuit is counted to determine the point of time when the crystal oscillator circuit should begin oscillation. Thus, the invention described herein is intended to embrace all such alternatives, modifications, applications and variations as fall within the spirit and scope of the appended claims.

What is claimed is:

1. A semiconductor integrated circuit device comprising:
   a first piezoelectric type oscillator circuit operative when driven by a first source voltage to generate a first clock signal employed as the clock signal for operation of an internal circuit in said device,
   a second oscillator circuit driven by a second source voltage lower than said first source voltage to generate a second clock signal, and
   a voltage boost circuit comprising a two phase clock generating circuit responsive to said second clock signal to provide two output clock signals of different phase and a switching circuit to receive said phased clock signals to monotonically generate a stepped up voltage higher in magnitude than said second source voltage in response to said phased clock signals,
   said stepped up voltage being supplied at least to said first oscillator circuit as its circuit source voltage.

2. The semiconductor integrated circuit device of claim 1 wherein said piezoelectric type oscillator is a crystal oscillator.

3. The semiconductor integrated circuit device of claim 1 wherein said piezoelectric type oscillator circuit is a ceramic oscillator.

4. The semiconductor integrated circuit device of claim 2 or 3 wherein said second oscillator circuit is a CR oscillator circuit.

5. The semiconductor integrated circuit device of claim 4 wherein said switching circuit comprises a plurality of capacitances and switch means for switching between mutual connective relationships relative to said capacitances.

6. A semiconductor integrated circuit device comprising:
   a first piezoelectric type oscillator circuit operative when driven by a first source voltage to generate a first clock signal employed as the clock signal for operation of an internal circuit in said device,
   a second oscillator circuit driven by a second source voltage lower than said first source voltage to generate a second clock signal,
   an oscillation detecting circuit for detecting whether or not said first oscillator circuit is in an oscillating or non-oscillating state to generate a clock selection control signal of a first type when said first oscillator circuit is in a non-oscillating state and to generate a clock selection control signal of a second type when said first oscillator circuit is in an oscillating state,
   said oscillation detecting circuit being operative to terminate the oscillation of said second oscillator circuit in response to said second type clock selection control signal when said first oscillator circuit is in its oscillating state, and
   a voltage boost circuit for generating a stepped up voltage higher in magnitude than said second source voltage in response to said second clock signal, said stepped up voltage being supplied at least to said first oscillator circuit as its circuit source voltage.

7. The semiconductor integrated circuit of claim 6 wherein said piezoelectric type oscillator is a crystal oscillator or a ceramic oscillator.

8. The semiconductor integrated circuit device of claim 7 wherein said second oscillator circuit is a CR oscillator circuit.

9. The semiconductor integrated circuit device of claim 8 wherein said voltage boost circuit comprises a plurality of capacitances and switch means for switching between mutual connective relationships relative to said capacitances.

10. A semiconductor intergrated circuit device comprising:
    a first oscillator circuit operative when driven by a first source voltage to generate a first clock signal employed as the clock signal for operation of an internal circuit in said device.,
    a second oscillator circuit driven by a second source voltage lower that said first source voltage to generate a second clock signal,
    an oscillation detecting circuit for detecting whether or not said first oscillator circuit is in an oscillating or non-oscillating state to generate a clock selection control signal of a first type when said first oscillator circuit is in a non-oscillating state and to genrate a clock selection control signal of a second type when said first oscillator circuit is in an oscillating state,
    said oscillation detecting circuit being operative to terminate the oscillatin of said second oscillator circuit in response to said second type clock selection control signal when said first oscillator circuit is in its oscillating state,
    a voltage boost circuit for generating a stepped up voltage higher in magnitude than said second source voltage in response to said second clock signal, and
    a constant voltage circuit for receiving said stepped up voltage and converting said stepped up voltage to a constant voltage, said constant voltage being supplied at least to said first oscillator circuit as its circuit source voltage.

11. The semiconductor intergrated circuit device of claim 10 wherein said first oscillator circuit is a crystal oscillator or a ceramic oscillator.

12. The semiconductor intergrated circuit device of claim 1 wherein said second oscillator circuit is a CR oscillator circuit.

13. The semiconductor integrated circuit device of claim 12 wherein said voltage boost circuit comprises a plurality of capacitances and switch means for switching between mutual connective relationships relative to said capacitances.

14. An oscillator circuit having a piezoelectric resonator and a semiconductor integrated circuit device, said semiconductor integrated circuit device comprising:
    a first oscillator circuit connected to said piezoelectric resonator and, when driven by a first source voltage, said oscillator circuit is operative to generate a first clock signal employed as the clock signal for operation of an internal circuit in said device,
    a second oscillator circuit driven by a second source voltage lower than said first source voltage to generate a second clock signal, and
    a voltage boost circuit comprising a two phase clock generating circuit responsive to said clock signal to provide two output clock signals of different phase and a switching circuit to received said phased clock signals to monotonically generate a stepped up voltage higher in magnitude than said second source voltage in response to said phased clock signals,
    said stepped up voltage being supplied at least to said first oscillator circuit as its circuit source voltage.

15. A semiconductor integrated circuit device comprising:
    a first oscillator circuit operative when driven by a first source voltage to generate a first clock signal employed as the clock signal for operation of an internal circuit in said device,
    a second oscillator circuit driven by a second source voltage lower than said first source voltage to generate a second clock signal,
    an oscillation detecting circuit for detecting whether or not said first oscillator circuit is in an oscillating or non-oscillating state to generate a clock selection control signal of a first type, when said first oscillator circuit is in a non-oscillating state and to generate a clock slection control signal of a second type when said first oscillator circuit is in an oscillating state,
    a clock signal selecting circuit to receive either said first type or said second type clock selection control signal for respectively selecting either said second or said first clock signal for output.

said oscillating detecting circuit causing the termination of the oscillation of said second oscillator circuit when said first oscillator circuit is in its oscillating state.

16. The semiconductor integrated circuit device of claim 15 including a voltage boost circuit for generating a stepped up voltage higher in magnitude than said second source voltage in response to said second clock signal, said stepped up voltage being supplied at least to said first oscillator circuit and said internal circuit as their circuit source voltage.

17. The semiconductor integrated circuit device of claim 1 wherein said voltage boost circuit generates said stepped up voltage in response to said first clock signal when said first oscillator circuit is in its oscillation state.

18. The semiconductor integrated circuit device of claim 17 wherein said stepped up voltage is supplied at least to both said first oscillator circuit and said internal circuit.

19. The semiconductor integrated circuit device of claim 6 wherein said voltage boost circuit generates said stepped up voltage in response to said first clock signal when said first oscillator circuit is in its oscillation state.

20. The semiconductor integrated circuit device of claim 19 wherein said stepped up voltage is supplied to said first oscillator circuit and said internal circuit as their circuit source voltage.

21. The semiconductor integrated circuit device of claim 20 further comprising a clock signal selecting circuit to receive either said first type or said second type clock selection control signal for selecting either said second or said first clock signal to supply to said voltage boost circuit.

22. A semiconductor integrated circuit device comprising:

a first piezoelectric type oscillator circuit operative when driven by a first source voltage to generate a first clock signal employed as the internal system clock signal for operation of an internal circuit in said device, a second oscillator circuit driven by a second source voltage lower than said first source voltage to generate a second clock signal, an oscillation detecting circuit for detecting whether or not said first oscillator circuit is in an oscillating or non-oscillating state to generate a clock selection control signal of a first type when said first oscillator circuit is in a non-oscillating state and to generate a clock selection control signal of a second type when said first oscillation circuit is in an oscillating state, a clock signal selecting circuit to receive either said first type or said second type clock selection control signal for respectively selecting either said second or said first clock signal for output, said oscillating detecting circuit being operative to terminate the oscillation of said second oscillator circuit when said first oscillator circuit is in its oscillating state, and a voltage boost circuit for generating a stepped up voltage higher in magnitude than said second source voltage in response to said second clock signal, said stepped up voltage being supplied at least to said first oscillator circuit and said internal circuit as their circuit source voltage.

23. The semiconductor integrated circuit device of claim 22 wherein said first oscillator circuit is a crystal oscillator or a ceramic oscillator and said second oscillator circuit is a CR oscillator circuit.

24. The semiconductor integrated circuit device of claim 10 wherein said voltage boost circuit generates said stepped up voltage in response to said first clock signal when said first oscillator circuit is in its oscillation state.

25. The semiconductor integrated circuit device of claim 24 wherein said stepped up voltage is supplied to said first oscillator circuit and said integrated circuit as their circuit source voltage.

26. The oscillator circuit of claim 14 further comprising an oscillation detecting circuit for detecting whether or not said first oscillator circuit is in an oscillating or non-oscillating state to generate a clock selection control signal of a first type when said first oscillator circuit is in a non-oscillating state and to generate a clock section control signal of a second type when said first oscillator circuit is an oscillating state, said oscillation detecting circuit operative to terminate the oscillating of said second oscillator circuit in response to said second type clock selection control signal.

27. The oscillator circuit of claim 26 further comprising a constant voltage circuit for receiving said stepped up voltage and converting said stepped up voltage to constant voltage, said constant voltage being supplied to said first oscillator circuit as its source voltage.

* * * * *